United States Patent
Itatani et al.

(10) Patent No.: US 6,589,662 B1
(45) Date of Patent: Jul. 8, 2003

(54) COMPOSITE FILM

(75) Inventors: Hiroshi Itatani, Yokohama (JP); Shunichi Matsumoto, Kamakura (JP)

(73) Assignee: Pi R&D Co., Ltd., Kanagawa (JP)

( * ) Notice: Subject to any disclaimer, the term of this patent is extended or adjusted under 35 U.S.C. 154(b) by 0 days.

(21) Appl. No.: 09/806,452

(22) PCT Filed: Feb. 1, 1999

(86) PCT No.: PCT/JP99/00409
§ 371 (c)(1),
(2), (4) Date: Mar. 30, 2001

(87) PCT Pub. No.: WO00/41884
PCT Pub. Date: Jul. 20, 2000

(30) Foreign Application Priority Data

Jan. 13, 1999 (JP) .............................. 11-43648

(51) Int. Cl.[7] ........................ B32B 27/00; B32B 15/08; B32B 27/08
(52) U.S. Cl. ................ 428/473.5; 428/209; 428/411.1; 428/413; 428/416; 428/418; 528/353; 528/170
(58) Field of Search .............................. 428/473.5, 416, 428/411.1, 413, 418, 209; 528/353

(56) References Cited

U.S. PATENT DOCUMENTS 5,502,143 A * 3/1996 Oie et al. ................... 528/353
6,270,900 B1 * 8/2001 Wakizaka et al. ......... 428/411.1
6,320,019 B1 * 11/2001 Lee et al. .................... 528/353

FOREIGN PATENT DOCUMENTS

| EP | 0604319 A | | 6/1994 |
| JP | 02158634 A | | 6/1990 |
| JP | 04-366194 A | * | 12/1992 |
| JP | 05-112760 A | * | 5/1993 |
| JP | 07-157560 A | * | 6/1995 |

* cited by examiner

Primary Examiner—P. Hampton-Hightower
(74) Attorney, Agent, or Firm—Birch, Stewart, Kolasch & Birch, LLP

(57) ABSTRACT

A composite film having an excellent heat resistance is disclosed. The composite film according to the present invention comprises a substrate film and polyimide membrane(s) formed on at least one surface of the substrate film, which polyimide membrane(s) is(are) prepared by applying a solution of a solvent-soluble polyimide whose main chain is formed by polycondensation of one or more tetracarboxylic dianhydrides and one or more diamines and by drying the solution. The solvent-soluble polyimide comprises bicyclo(2,2,2)oct-7-ene-2,3,5,6-tetracarboxylic dianhydride as at least a part of the tetracarboxylic dianhydride(s) and/or at least one of 3,5-diaminobenzoic acid and a diaminosiloxane derivative as at least a part the diamine(s).

13 Claims, No Drawings

COMPOSITE FILM

This application is the national phase under 35 U.S.C. §371 of PCT International Application No. PCT/JP99/00409 which has an International filing date of Feb. 1, 1999, which designated the United States of America.

TECHNICAL FIELD

The present invention relates to a composite film. More particularly, the present invention relates to a composite film whose surface is coated with polyimide membrane(s), which is excellent in heat resistance.

BACKGROUND ART

Films made of polyester resins, especially polyethylene terephthalate resins or polyethylene naphthalte resins, and films made of polyphenylene sulfide resins are widely used in various industrial fields because of the good processabilities, excellent mechanical properties, chemical properties, and the like.

However, the above-mentioned films made of polyester resins and polyphenylene sulfide resins have a drawback in that their glass transition points are low and so their heat resistances are poor for industrial uses at high temperatures, so that they cannot be used as the parts subjected to high temperatures.

In view of this, various composite films have been proposed, in which membranes made of materials which compensate the drawback of the resins are formed on the surfaces of the films made of the resins. For example, Japanese Laid-open Patent Application (Kokai) No. 57-167256 discloses a process for producing a heat resistant resin film by immersing a fluororesin film in a solution of polyamic acid in N-methyl-2-pyrrolidone to coat the film surfaces with the polyamic acid resin, and by heating the resultant to dry. However, to convert the polyamic acid into polyimide resin, dehydration and imidation reaction are necessary, so that heat treatment at a temperature as high as 300° C. is necessary.

If the polyamic acid is applied to a film made of a polyester resin or polyphenylene sulfide resin, which has a low melting point, the substrate film per se is melted, so that this method cannot be employed. On the other hand, since ordinary polyimides are insoluble in solvents, thin membranes of such polyimides cannot be formed on film surfaces.

DISCLOSURE OF THE INVENTION

An object of the present invention is to provide a composite film which is excellent in heat resistance and in adhesiveness of the surface layer.

The present inventors intensively studied to discover that by applying a solution of a solvent-soluble polyimide containing a specific compound as an acid component or diamine component and by drying the solution to form a polyimide membrane, a composite film having excellent heat resistance can be obtained and the polyimide membrane has excellent adhesiveness with the substrate film, thereby completing the present invention.

That is, the present invention provides a composite film comprising a substrate film and polyimide membrane(s) formed on at least one surface of said substrate film, which polyimide membrane(s) is(are) prepared by coating said surface(s) with a solution of a solvent-soluble polyimide whose main chain is formed by polycondensation of one or more tetracarboxylic dianhydrides and one or more diamines and by drying said solution, said one or more tetracarboxylic dianhydrides including bicyclo(2,2,2)oct-7-ene-2,3,5,6-tetracarboxylic dianhydride as at least a part thereof, and/or said one or more diamines including at least one of 3,5-diaminobenzoic acid and a diaminosiloxane derivative as at least a part thereof.

Since polyimide membrane(s) which is(are) excellent in heat resistance, chemical resistance and insulation performance is(are) formed on the surface(s) of the substrate film, the composite film according to the present invention is excellent in heat resistance, chemical resistance and insulation performance. Further, the adhesiveness between the substrate film and the polyimide membrane is excellent. Therefore, the composite film according to the present invention may be applied for various uses for which heat resistance, chemical resistance and/or insulation performance are demanded. The present invention has excellent advantageous effects in that polyimide in the form of membrane can directly be formed on the substrate films with low melting points, so that the advantageous properties of both of the substrate film and the polyimide may be synergistically exerted, that the production is easy and that the production cost is low.

BET MODE FOR CARRYING OUT THE INVENTION

As mentioned above, the composite film according to the present invention comprises a substrate film and polyimide membrane(s) formed on at least one surface of the substrate film. As the substrate film, films made of thermoplastic resins on which polyimide membranes could not be formed thereon hitherto because of the low heat resistances may be advantageously employed. Examples of such a thermoplastic resin include polyesters such as polyethylene terephthalates and polyethylene naphthalates, and polyphenylene sulfides. The thickness of the substrate film is not restricted at all and is usually about 10 to 200 μm. As the substrate film, commercially available various films may be employed.

The composite film according to the present invention is obtained by applying a solution of a solvent-soluble polyimide whose main chain is formed by polycondensation of one or more tetracarboxylic dianhydrides and one or more diamines on at least one surface of the above-mentioned substrate film, and by drying the solution so as to form polyimide membrane(s) on the surface(s).

The polyimide used in the present invention is solvent-soluble. As the solvent, N,N-dimethylformamide (DMF), N,N-dimethylacetamide (DMAc), dimethylsulfoxide (DMSO), N-methylpyrrolidone (NMP), tetramethylurea, sulfolane or the like may be employed. Preferably, DMF or NMP is employed. In the present specification, the term "solvent soluble" means that the polyimide is dissolved in N-methyl-2-pyrrolidone (NMP) to a concentration of not less than 5% by weight, preferably not less than 10% by weight.

The tetracarboxylic dianhydride(s) used for forming the main chain of the molecule of the solvent-soluble polyimide is(are) not restricted. Examples of the tetracarboxylic dianhydrides include aromatic acid dianhydrides such as biphenyltetracarboxylic dianhydride, benzophenonetetracarboxylic dianhydride, bis(dicarboxyphenyl)propane dianhydride, bis(dicarboxyphenyl)sulfone dianhydride, bis(dicarboxyphenyl)ether dianhydride, thiophenetetracarboxylic dianhydride, pyromellitic dianhydride and naphthalenecarboxylic dianhydride; and acid dianhydrides such as 1,2,3,4-butanetetracarboxylic dianhydride, bicyclo(2,2,2)-oct-7-ene-2,3,5,6-tetracarboxylic dianhydride and 4,4'-{2,2,2-trifluoro-1-(trifluoromethyl)ethylidene}bis(1,2-benzenedicarboxylic dianhydride). These may be used individually or in combination.

Examples of the diamines used for forming the main chain of the molecule of the solvent-soluble polyimide include 4,4'-diaminodiphenylpropane, 4,4'-diaminodiphenylmethane, 3,3'-diaminodiphenylmethane, 4,4'-diaminodiphenyl sulfide, 4,4'-diaminodiphenyl sulfone, 3,3'-diaminodiphenyl sulfone, 3,4'-diaminodiphenyl sulfone, 4,4'-diaminodiphenyl ether, 3,4'-diaminodiphenyl ether, 4,4'-diaminobenzophenone, 3,3'-diaminobenzophenone, 2,2'-bis(4-aminophenyl)propane, benzidine, 3,3'-diaminobiphenyl, 2,6-diaminopyridine, bis{4-(4-aminophenoxy)phenyl}sulfone, bis{4-(3-aminophenoxy)phenyl}sulfone, bis{4-(4-aminophenoxy)phenyl}ether, bis{4-(3-aminophenoxy)phenyl}ether, 2,2'-bis{4-(4-aminophenoxy)phenyl}propane, 2,2'-bis{4-(3-aminophenoxy)phenyl}propane, 4,4'-bis(4-aminophenoxy)biphenyl, 2,2'-bis{4-(3-aminophenoxy)phenyl}-hexafluoropropane, 1,5-diaminonaphthalene, 2,2'-bis{4-(4-aminophenoxy)phenyl}hexafluoropropane, 1,4-bis(4-aminophenoxy)benzene, 1,3-bis(4-aminophenoxy)benzene, 3,5-diaminobenzoic acid, diaminosiloxane derivatives, 1,4-benzenediamine, 1,3-benzenediamine, 6-methyl-1,3-benzenediamine, 4,4'-diamino-3,3'-dimethyl-1,1'biphenyl, 4,4'-diamino-3,3'-hydrox-1,1'biphenyl, 4,4'-diamino-3,3'-dimethox-1,1'biphenyl, 4,4'-oxybis(benzeneamine), 3,4'-oxybis(benzeneamine), 4,4'-methylenebis(benzeneamine) and 3,3'-carboxybis(benzeneamine), although the diamines are not restricted to these. These diamine components may be used individually or in combination.

To promote the adhesiveness of the polyimide to the substrate film, the polyimide used in the present invention contains, among the above-mentioned tetracarboxylic dianhydrides, bicyclo(2,2,2)oct-7-ene-2,3,5,6-tetracarboxylic dianhydride as a tetracarboxylic dianhydride, and contains at least one selected from the group consisting of 3,5-diaminobenzoic acid and diaminosiloxane derivatives as diamine(s). To attain sufficient adhesiveness, the content of bicyclo(2,2,2)oct-7-ene-2,3,5,6-tetracarboxylic dianhydride in the total tetracarboxylic dianhydrides is preferably 20 to 50 mol %, more preferably about 30 to 50 mol %, and the content of the total of the above-mentioned 3,5-diaminobenzoic acid and the diaminosiloxane derivative in the total diamines is preferably 10 to 65 mol %, more preferably about 35 to 60 mol %.

As the diaminosiloxane derivative, those having amine values (the value obtained by dividing the molecular weight of the compound with the number of amino groups) of about 200 to 1000 are preferred, and bis(3-amino-($C_1$-$C_6$)alkyl-polydimethylsiloxanes are especially preferred. The diaminosiloxane derivatives having the above-mentioned amine value may easily be obtained by removing low boiling components from the commercially available diaminopolysiloxane derivatives (usually, a mixture of polysiloxanes with different polymerization degrees).

To promote the adhesiveness with the substrate film, the polyimide preferably contains as diamine component(s), in addition to the above-mentioned diaminosiloxane derivative having an amine value of 200 to 1000, at least one diamine selected from the group consisting of 3,4'-diaminodiphenyl ether, 1,4-bis(3-aminophenoxy)benzene, bis-{4(3-aminophenoxy)phenyl}sulfone and 3,5-diaminobenzoic acid. By containing the diamine(s), the adhesiveness with the substrate film is especially excellent. Further, since these diamines are stably and inexpensively available industrially, the polyimide is especially suited for industrial production. In this case, the content of the diaminosiloxane derivative in the polyimide is preferably about 15 to 60% by weight, especially 20 to 50% by weight, and the content of the total of at least one diamine selected from the group consisting of 3,4'-diaminodiphenyl ether, 1,4-bis(3-aminophenoxy)benzene, bis-{4(3-aminophenoxy)phenyl}sulfone and 3,5-diaminobenzoic acid in the polyimide is preferably about 10 to 50% by weight, especially about 13 to 40% by weight.

The polyimide employed in the present invention preferably has a weight average molecular weight measured by gel permeation chromatography method (GPC method using a UV detector) in terms of polystyrene of 15,000 to 100,000, more preferably about 20,000 to 70,000. If the molecular weight is within this range, a composite film having excellent adhesiveness between the polyimide membrane and the substrate film, and excellent heat resistance, chemical resistance and insulation performance is obtained.

The polyimide in the composition according to the present invention may be produced by direct imidation reaction between the above-mentioned tetracarboxylic dianhydride(s) and the above-mentioned diamine(s). In the productions of the conventional polyimide molded articles, polyamic acids are used. The polyamic acids are easily decomposed at room temperature, so that the storage stabilities are poor. Further, to convert the polyamic acid into polyimide, it is necessary to subject the polyamic acid to a heat treatment at 250 to 350° C. so as to carry out imidation reaction. In contrast, the polyimide used in the present invention is directly produced by the imidation reaction between the tetracarboxylic dianhydride(s) and diamine(s), and not through a polyamic acid, so that the polyimide in the present invention is largely different from the conventional polyimide molded articles in this respect.

The direct imidation reaction between the tetracarboxylic dianhydride(s) and the diamine(s) may be carried out using a catalytic system utilizing the following equilibrium reaction between a lactone, base and water.

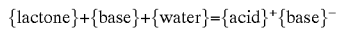

A polyimide solution may be obtained by using the {acid}$^+${base}$^-$ system as a catalyst and heating the reaction mixture at 140–180° C. The water produced by the imidation reaction is eliminated from the reaction system by azeotropic distillation with toluene which is a reaction solvent. When the imidation in the reaction system is completed, {acid}$^+${base}$^-$ is converted to the lactone and the base, and they lose the catalytic activity and are removed from the reaction system. The polyimide solution produced by this process can be applied to the substrate film as it is as a polyimide solution with high purity because the above-mentioned catalytic substances are not contained in the polyimide solution after the reaction.

Examples of the reaction solvent which may be used in the above-mentioned imidation reaction include, in addition to the above-mentioned toluene, N-methyl-2-pyrrolidone, dimethylformamide, dimethylacetamide, dimethylsulfoxide, sulfolane, tetramethylurea and the like.

As the lactone, γ-valerolactone is preferred. As the base, pyridine and/or methylmorpholine is(are) preferred.

Crotonic acid may be used in place of lactone.

The mixing ratio (acid/diamine) between the tetracarboxylic dianhydride(s) and the diamine(s) subjected to the imidation reaction is preferably about 1.05 to 0.95 in terms of molar ratio. Further, the concentration of the lactone is preferably about 5 to 30 mol % based on the concentration of the acid dianhydrides, and the concentration of the base is preferably about 100 to 200 mol % based on the lactone, at the initiation of the reaction. The reaction time is not restricted and varies depending on the molecular weight of the polyimide to be produced and the like, and usually about 2 to 10 hours. It is preferred to carry out the reaction under stirring in nitrogen atmosphere.

It should be noted that the production process per se of the polyimide using the binary catalytic system comprising the lactone and the base is known, and described in, for example, U.S. Pat. No. 5,502,143.

By carrying out the above-described imidation reaction sequentially in two steps using different acid dianhydrides and/or different diamines, polyimide block copolymers can be produced. By the conventional process for producing polyimide through polyamic acid, only random copolymers can be produced as copolymers. Since polyimide block copolymers can be produced selecting arbitrary acids and/or diamines, desired properties or functions such as adhesiveness, dimensional stability, low dielectric constant and the like can be given to the polyimide. In the composite film of the present invention, such a polyimide copolymer may also preferably be employed.

A preferred process for producing the polyimide block copolymers include the process wherein a polyimide oligomer is produced using the acid catalyst generated by the above-described lactone and the base, and using either one of the diamine component or the tetracarboxylic dianhydride in excess, and then the diamine and/or the tetracarboxylic dianhydride is(are) added (the molar ratio of the total aromatic diamines to the total tetracarboxylic dianhydrides is 1.05 to 0.95), thereby carrying out two-step polycondensation.

Since the polyimide produced by the method described above is in the form of a solution dissolved in a solvent, the solution may be applied as it is, or after being diluted with toluene, dioxane, dioxolane, anisole or a polar solvent mentioned above, to one or both surfaces of the substrate film. Since the polyimide solution to be applied is a solution of the polyimide after completion of the imidation reaction, unlike the production of the conventional polyimide molded articles through the polyamic acid, it is not necessary to carry out imidation reaction by heating after the application of the solution. Further, since the solution is a solution of the polyimide (not a solution of polyamic acid), the storage stability is good and it is not decomposed upon contact with water, which are advantageous.

Before application of the above-mentioned polyimide solution, the surface(s) of the substrate film is(are) cleaned by washing with water or with a solvent such as acetone or methanol and then drying the solvent. If the surface(s) of the substrate film is(are) clean, this step may be omitted.

The cleaned surface(s) of the substrate film is(are) coated with the above-mentioned polyimide solution and the thickness of the polyimide solution on the film surface(s) is made uniform with a device such as an applicator.

The substrate film whose surface is uniformly coated with the polyimide solution is placed in a drier and the solvent of the polyimide solution is removed at a temperature at which the substrate film is not deformed, that is, at 80° C. to 200° C., preferably at 90° C. to 150° C. when the substrate film is a polyester film or a polyphenylene sulfide film.

In cases where polyimide membranes are formed on both surfaces of the substrate film, the above-mentioned step of application of the polyimide and the step of drying are respectively carried out for both the front and back surfaces, thereby the polyimide membranes can be formed on both surfaces of the substrate film.

As for the method of application of the polyimide solution to the film surface, in addition to the method using an applicator, continuous methods for producing composite films, including screen printing method, gravure coating method and spray coating method, which are known in the art, may also be employed.

The thickness of the polyimide membrane after drying is not restricted, and usually and preferably about 0.1 to 30 $\mu$m, especially about 0.2 to 10 $\mu$m.

The polyimide membranes thus formed, especially polyimide block copolymer membranes, typically have the following physical properties. By selecting the components for forming the polyimide block copolymer, polyimide block copolymers having physical properties which are different from those mentioned below can also be produced.
1) Thermal Properties
   Glass Transition Point: 180° C. to 350° C.
   Thermal Decomposition Initiation Temperature: 400° C. to 550° C.
2) Electrical Properties
   Volume Resistivity: Not less than $10^{17}$ ohms
   Dielectric Constant: 2.5 to 3.5
3) Mechanical Properties
   Tensile Strength: 10 to 25 kgf/mm$^2$
   Tensile Elongation: 20 to 200%
   Tensile Elasticity: 200 to 350 kf/m$^2$
   Water Absorption: 1.0 to 2.0%

Uses of the composite film according to the present invention, exploiting the above-mentioned properties will now be described.

Exploiting the improvement in the thermal properties, the composite film can be used as a heat resistant composite film. In cases where the substrate film is a polyethylene naphthalate film, although the withstand temperature in mechanical uses is 160° C., the withstand temperature of the composite film whose both surfaces are coated with the polyimide membranes formed by applying the polyimide solution to a thickness of 3 $\mu$m was improved to 210° C.

As for the electrical properties, the volume resistivity was improved from $10 \times 10^{17}$ ohm·cm of the substrate film to $45 \times 10^{17}$ ohm·cm of the composite film.

Therefore, the composite film according to the present invention can be applied to various uses such as wall-paper, surface-protecting films of various articles, insulation films, circuit boards and resistors, which exploit the heat resistance, chemical resistance and/or insulation performance.

EXAMPLES

The invention will now be described more concretely by way of examples thereof. It should be noted, however, the examples are presented for the illustration purpose only and should not be interpreted in any restrictive way.

Example 1

To a three-necked 2L flask, a stainless steel anchor agitator, a nitrogen-introducing tube, and a condenser comprising a cooling tube having balls mounted on a trap with a stop cock, were attached.

To the flask, 29.42 g (100 mmol) of 3,4,3',4'-biphenyltetracarboxylic dianhydride, 43.9 g (50 mmol) of bis(3-aminopropyl)-polydimethylsiloxane (amine value: 416, commercial product of Shin-etsu Chemical Co., Ltd.), 1.5 g (15 mmol) of γ-valerolactone, 2.4 g (30 mmol) of pyridine, 150 g of N-methylpyrrolidone and 60 g of toluene were added, and the mixture was heated at 180° C. for 1 hour.

After cooling the mixture in the air, 16.11 g (50 mmol) of benzophenonetetracarboxylic dianhydride, 20.53 g (50 mmol) of 2,2-bis{4-(4-aminophenoxy)phenyl}propane, 21.63 g (50 mmol) of bis{4-(3-aminophenoxy)phenyl}sulfone and 229 g of N-methylpyrrolidone were added, and the resulting mixture was incubated at room temperature for 1 hour and then heated at 180° C. for 4.25 hours. The polyimide solution after removing the reaction reflux had a concentration of polyimide of 25%.

The molecular weight, in terms of polystyrene, of the thus produced polyimide block copolymer was measured by the GPC method using a UV detector (HLC820 commercially available from Tosoh Corporation was used). The number average molecular weight was 29,800, the weight average molecular weight was 55,000 and Z average molecular weight was 99,300. The polyimide block copolymer solution was diluted with dioxolane to prepare a varnish with a polyimide concentration of 20%, and the varnish was applied to the both surfaces of a polyethylene terephthalate film (G-2, commercial product of TEIJIN LIMITED, 50 μm thickness, substrate film) (Film A) by a gravure coater to obtain a composite film having polyimide membranes with a thickness of 1 μm on both surfaces, followed by drying the polyimide block copolymer solution in an incubator at 80 to 150° C. The film was subjected to a no-load heat treatment (150° C. for 10 minutes) in the air and the adhesiveness between the polyimide membrane and the substrate film was evaluated by cross cut test (2 mm intervals). The cross cut test was performed as follows in accordance with JIS-K-5400. The coating membrane was cross cut such that each lattice had a square shape sizing 2 mm×2 mm. A cellophane-tape was adhered to the cross cut surface and immediately peeled off. The number of the cross cut squares remained on the substrate film after peeling of the cellophane-tape was counted and the result is expressed in terms of the number of remained squares per 100 squares before the peeling. For example, if this value is 100/100, the number of peeled off squares among the 100 squares is zero.

As a result, the adhesion rate was 100/100. Thus, it was confirmed that the Composite Film A according to the present invention had excellent adhesion with the substrate film.

Example 2

The operations similar to Example 1 were repeated. That is, to the flask, 29.42 g (100 mmol) of biphenyltetracarboxylic dianhydride, 80 g (50 mmol) of bis(3-aminopropyl)-polydimethylsiloxane (amine value: 800), 1.0 g (10 mmol) of γ-valerolactone, 1.6 g (20 mmol) of pyridine, 150 g of N-methylpyrrolidone and 100 g of toluene were added, and the mixture was heated at 180° C. for 1 hour.

After cooling the mixture in the air, 16.11 g (50 mmol) of benzophenonetetracarboxylic dianhydride, 43.25 g (100 mmol) of bis{4-(3-aminophenoxy)phenyl}sulfone and 125 g of N-methylpyrrolidone were added, and the resulting mixture was heated at 180° C. for 1.5 hours under stirring at 180 rpm, and then at 160° C. for 1 hour. The polyimide solution after removing the reaction reflux had a concentration of polyimide of 40%.

The molecular weight of the thus produced polyimide block copolymer was measured as in Example 1. The number average molecular weight was 17,700, the weight average molecular weight was 29,900 and Z average molecular weight was 46,800.

The polyimide block copolymer solution was diluted with dioxolane to prepare a varnish with a polyimide concentration of 20%. The varnish was applied to the both surfaces of a polyethylene terephthalate film (G-2, commercial product of TEIJIN LIMITED, 50 μm thickness, substrate film) (Film B), and to the both surfaces of a polyphenylene sulfide film (Torelina, commercial product of TORAY INDUSTRIES, INC., 75 μm thickness, substrate film) (Film C) by a gravure coater and dried at 130° C. for 5 minutes to form polyimide membranes with a thickness of 2.5 μm on the both surfaces of the films, thereby obtaining Composite Film B-2.5 and Composite Film C-2.5. The films were subjected to a no-load heat treatment in the air in a high temperature incubator at 210° C. for 10 minutes, and the adhesiveness between the polyimide membranes and the substrate films was evaluated by cross cut test (1 mm intervals).

As a result, both films had an adhesion rate of 100%, so that it was confirmed that the Composite Films B and C according to the present invention had excellent adhesion with the substrate film.

Example 3

The operations similar to Example 1 were repeated. That is, to the flask, 29.42 g (100 mmol) of biphenyltetracarboxylic dianhydride, 175.6 g (200 mmol) of bis(3-aminopropyl)-polydimethylsiloxane (amine value: 439), 2.0 g (20 mmol) of γ-valerolactone, 3.2 g (40 mmol) of pyridine, 200 g of N-methylpyrrolidone and 60 g of toluene were added, and the mixture was heated at 180° C. for 1 hour.

After cooling the mixture in the air, 64.45 g (200 mmol) of benzophenonetetracarboxylic dianhydride, 43.25 g (100 mmol) of bis{4-(3-aminophenoxy)phenyl}sulfone and 253 g of N-methylpyrrolidone were added, and the resulting mixture was heated at 180° C. for 4 hours. The polyimide solution after removing the reaction reflux had a concentration of polyimide of 40%.

The molecular weight of the thus produced polyimide block copolymer was measured as in Example 1. The number average molecular weight was 16,500, the weight average molecular weight was 26,000 and Z average molecular weight was 36,800.

The polyimide block copolymer solution was diluted with dioxolane to prepare a varnish with a polyimide concentration of 20%. The varnish was applied to the both surfaces of polyethylene terephthalate films (G-2, commercial product of TEIJIN LIMITED, 50 μm thickness, substrate film) (Film D), and to the both surfaces of polyphenylene naphthalate films (Teonex, commercial product of TEIJIN LIMITED, 75 μm thickness, substrate film) (Film E) and dried at 130° C. for 5 minutes to form polyimide membranes with thicknesses of 1 μm and 2.0 μm on the both surfaces of each of the films, thereby obtaining Composite Film D-1.0, Composite Film D-2.0, Composite Film E-1.0 and Composite Film E-2.0. The films were subjected to a no-load heat treatment in the air in a high temperature incubator at 210° C. for 10 minutes, and the adhesiveness between the polyimide membranes and the substrate films was evaluated by cross cut test (1 mm intervals).

As a result, all of the films had an adhesion rate of 100/100, so that it was confirmed that the Composite Films D and E according to the present invention had excellent adhesion with the substrate film.

Example 4

The operations similar to Example 1 were repeated. That is, to the flask, 14.89 g (60 mmol) of bicyclo(2,2,2)-oct-7- ene-2,3,5,6-tetracarboxylic dianhydride, 6.49 g (30 mmol) of 4,4'-diaminodiphenyl sulfide, 1.2 g (12 mmol) of γ-valerolactone, 1.6 g (20 mmol) of pyridine, 80 g of N-methylpyrrolidone and 30 g of toluene were added, and the mixture was heated at 180° C. for 1 hour.

After cooling the mixture in the air, 19.33 g (60 mmol) of benzophenonetetracarboxylic dianhydride, 53.4 g (60 mmol) of bis(3-aminopropyl)-polydimethylsiloxane (amine value: 445, commercial product of Shin-etsu Chemical Co., Ltd.), 14.27 g (33 mmol) of bis-[4-(3-aminophenoxy) phenylsulfone, 0.98 g (6 mmol) of 5-norbornene-2,3-dicarboxylic dianhydride, 77 g of N-methylpyrrolidone and 30 g of toluene were added, and the resulting mixture was heated at 180° C. for 4 hours under stirring at 180 rpm, and then at 180° C. for 35 minutes under stirring at 100 rpm. The polyimide solution after removing the reaction reflux had a concentration of polyimide of 40%.

The molecular weight of the thus produced polyimide block copolymer was measured as in Example 1. The number average molecular weight was 27,200, the weight average molecular weight was 47,200 and Z average molecular weight was 75,600.

The polyimide block copolymer solution was diluted with dioxolane to prepare a varnish with a polyimide concentration of 20%. The varnish was applied to the both surfaces of a polyphenylene sulfide film (Torelina, commercial product of TORAY INDUSTRIES, INC., 50 μm thickness, substrate film) and dried at 130° C. for 5 minutes to form polyimide membranes with a thickness of 0.5 μm on the both surfaces of the film, thereby obtaining Composite Film F-0.5. The film was subjected to a no-load heat treatment in the air in a high temperature incubator at 210° C. for 10 minutes, and the adhesiveness between the polyimide membranes and the substrate film was evaluated by cross cut test (1 mm intervals).

As a result, the adhesion rate was 100/100, so that it was confirmed that the Composite Film F according to the present invention had excellent adhesion with the substrate film.

Example 5

The operations similar to Example 1 were repeated. That is, to the flask, 19.86 g (80 mmol) of bicyclo(2,2,2)-oct-7-ene-2,3,5,6-tetracarboxylic dianhydride, 24.02 g (120 mmol) of 3,4-diaminobiphenyl ether, 2.4 g (24 mmol) of γ-valerolactone, 3.3 g (40 mmol) of pyridine, 200 g of N-methylpyrrolidone and 30 g of toluene were added, and the mixture was heated at 180° C. for 1 hour.

After cooling the mixture in the air, 47.08 g (80 mmol) of biphenyltetracarboxylic dianhydride, 35.6 g (40 mmol) of bis(3-aminopropyl)-polydimethylsiloxane (amine value: 445, commercial product of Shin-etsu Chemical Co., Ltd.), 36.50 g (84.4 mmol) of bis-{4-(3-aminophenoxy) phenyl}sulfone, 1.46 g (8.9 mmol) of 5-norbornene-2,3-dicarboxylic anhydride, 267 g of N-methylpyrrolidone and 70 g of toluene were added, and the resulting mixture was heated at 180° C. for 6 hours under stirring at 180 rpm. The polyimide solution after removing the reaction reflux had a concentration of polyimide of 25%.

The molecular weight of the thus produced polyimide block copolymer was measured as in Example 1. The number average molecular weight was 32,100, the weight average molecular weight was 51,700 and Z average molecular weight was 73,700.

The polyimide block copolymer solution was diluted with dioxolane to prepare a varnish with a polyimide concentration of 20%. The varnish was applied to the both surfaces of a polyethylene terephthalate film (G-2, commercial product of TEIJIN LIMITED, 50 μm thickness, substrate film) (Film A) and dried at 130° C. for 10 minutes to form polyimide membranes with a thickness of 2.5 μm on the both surfaces of the film, thereby obtaining Composite Film G-2.5. The film was subjected to a no-load heat treatment (150° C. for 10 minutes) in the air in a high temperature incubator for 80° C. to 150° C., and the adhesiveness between the polyimide membranes and the substrate films was evaluated by cross cut test (1 mm intervals).

As a result, the adhesion rate was 100/100, so that it was confirmed that the Composite Film G according to the present invention had excellent adhesion with the substrate film.

Example 6

The operations similar to Example 1 were repeated. That is, to the flask, 22.34 g (120 mmol) of bicyclo(2,2,2)-oct-7-ene-2,3,5,6-tetracarboxylic dianhydride, 29.0 g (90 mmol) of benzophenonetetracarboxylic dianhydride, 76.32 g (90 mmol) of bis(3-aminopropyl)-polydimethylsiloxane (amine value: 224, commercial product of Shin-etsu Chemical Co., Ltd.), 1.8 g (18 mmol) of γ-valerolactone, 2.4 g (30 mmol) of pyridine, 157 g of N-methylpyrrolidone and 50 g of toluene were added, and the mixture was heated at 180° C. for 1 hour under stirring at 180 rpm.

After cooling the mixture in the air, 6.85 g (45 mmol) of 3,5-diaminobenzoic acid, 21.41 g (49.5 mmol) of bis{4-(3-aminophenoxy)phenyl}sulfone, 1.30 g (9.0 mmol) of 5-norbornene-2,3-dicarboxylic anhydride, 65 g of N-methylpyrrolidone and 15 g of toluene were added, and the resulting mixture was heated at 180° C. for 3 hours under stirring at 180 rpm. The polyimide solution after removing the reaction reflux had a concentration of polyimide of 40%.

The molecular weight of the thus produced polyimide block copolymer was measured as in Example 1. The number average molecular weight was 18,900, the weight average molecular weight was 32,300 and Z average molecular weight was 50,600.

The polyimide block copolymer solution was diluted with dioxolane to prepare a varnish with a polyimide concentration of 20%. The varnish was applied to the both surfaces of a polyethylene terephthalate film (G-2, commercial product of TEIJIN LIMITED, 50 μm thickness, substrate film) (Film A) and dried at 130° C. for 8 minutes to form polyimide membranes with a thickness of 3.0 μm on the both surfaces of the film, thereby obtaining Composite Film H-3.0. The film was subjected to a no-load heat treatment (150° C. for 10 minutes) in the air in a high temperature incubator for 80° C. to 150° C., and the adhesiveness between the polyimide membranes and the substrate film was evaluated by cross cut test (1 mm intervals).

As a result, the adhesion rate was 100/100, so that it was confirmed that the Composite Film G according to the present invention had excellent adhesion with the substrate film.

Example 7

The operations similar to Example 1 were repeated. That is, to the flask, 117.68 g (400 mmol) of 3,4,3',4'-biphenyltetracarboxylic dianhydride, 166.4 g (200 mmol) of bis(3-aminopropyl)-polydimethylsiloxane (amine value: 416, commercial product of Shin-etsu Chemical Co., Ltd.), 4.0 g (40 mmol) of γ-valerolactone, 4.8 g (60 mmol) of pyridine, 200 g of N-methylpyrrolidone and 100 g of toluene were added, and the mixture was heated at 180° C. for 1 hour.

After cooling the mixture in the air, 20.02 g (100 mmol) of 3,4'-diaminodiphenyl ether, 41.06 g (100 mmol) of 2,2-bis{4-(4-aminophenoxy)phenyl}propane, 188 g of N-methylpyrrolidone and 50 g of toluene were added, and the resulting mixture was incubated at room temperature for 1 hour and then heated at 180° C. for 3 hours. The polyimide solution after removing the reaction reflux had a concentration of polyimide of 35%.

The molecular weight of the thus produced polyimide block copolymer was measured as in Example 1. The number average molecular weight was 21,500, and the weight average molecular weight was 34,800. The polyimide solution was diluted with dioxolane to prepare a varnish with a polyimide concentration of 20%. The varnish was applied to the both surfaces of polyethylene naphthalate films (Teonex, commercial product of TEIJIN LIMITED, 75 μm thickness, substrate film) by a gravure coater and dried at 130° C. for 5 minutes to form polyimide membranes with a thickness of 1 μm or 2.5 μm on the both surfaces of the films, thereby obtaining Composite Film 1 and Composite Film 2. The films were subjected to a no-load heat treatment in the air in a high temperature incubator at 210° C. for 10 minutes, and the adhesiveness between the polyimide membranes and the substrate films was evaluated by cross cut test (1 mm intervals).

As a result, both films had an adhesion rate of 100/100, so that it was confirmed that these composite films according to the present invention had excellent adhesion with the substrate film.

Example 8

The operations similar to Example 1 were repeated. That is, to the flask, 44.67 g (180 mmol) of bicyclo(2,2,2)-oct-7-ene-2,3,5,6-tetracarboxylic dianhydride, 13.69 g (90 mmol) of 3,5-diaminobenzoic acid, 3.6 g (36 mmol) of γ-valerolactone, 4.75 g (60 mmol) of pyridine, 240 g of N-methylpyrrolidone and 90 g of toluene were added, and the mixture was heated at 180° C. for 1 hour.

After cooling the mixture in the air, 58.0 g (180 mmol) of 3,4,3',4'-diphenyltetracarboxylic dianhydride, 149.76 g (180 mmol) of bis(3-aminopropyl)-polydimethylsiloxane (amine value: 416, commercial product of Shin-etsu Chemical Co., Ltd.), 42.82 g (99 mmol) of bis-4(3-aminophenoxy)phenylsulfone, 2.95 g (18 mmol) of 5-norbornene-2,3-dicarboxylic anhydride, 204 g of N-methylpyrrolidone and 90 g of toluene were added, and the resulting mixture was heated at 180° C. for 5.5 hours under stirring at 180 rpm. The polyimide solution after removing the reaction reflux had a concentration of polyimide of 40%.

The molecular weight of the thus produced polyimide block copolymer was measured as in Example 1. The number average molecular weight was 35,500 and the weight average molecular weight was 57,400. The glass transition point of this polyimide was 193° C. to 215° C., and the thermal decomposition initiation temperature was 422° C.

The polyimide solution was applied to the both surfaces of polyethylene naphthalate films (Teonex, commercial product of TEIJIN LIMITED, 75 μm thickness, substrate film) and dried at 130° C. for 8 minutes to form polyimide membranes with a thickness of 1 μm or 2.5 μm on the both surfaces of the films, thereby obtaining Composite Film 1 and Composite Film 2. The films were subjected to a no-load heat treatment in the air in a high temperature incubator at 200° C. for 10 minutes, and the adhesiveness between the polyimide membranes and the substrate films was evaluated by cross cut test (1 mm intervals).

As a result, both films had an adhesion rate of 100/100, so that it was confirmed that these composite films according to the present invention had excellent adhesion with the substrate film.

Example 9

The operations similar to Example 1 were repeated. That is, to the flask, 29.78 g (120 mmol) of bicyclo(2,2,2)-oct-7-ene-2,3,5,6-tetracarboxylic dianhydride, 36.04 g (180 mmol) of 3,4'-diaminodiphenyl ether, 3.0 g (30 mmol) of γ-valerolactone, 4.0 g (50 mmol) of pyridine, 200 g of N-methylpyrrolidone and 50 g of toluene were added, and the mixture was heated at 180° C. for 1 hour.

After cooling the mixture in the air, 44.13 g (150 mmol) of 3,4,3',4'-diphenyltetracarboxylic dianhydride, 25.90 g (60 mmol) of bis{4-(3-aminophenoxy)phenyl}sulfone, 26.7 g (30 mmol) of bis(3-aminopropyl)-polydimethylsiloxane (amine value: 416, commercial product of Shin-etsu Chemical Co., Ltd.), 273 g of N-methylpyrrolidone and 50 g of toluene were added, and the resulting mixture was heated at 180° C. for 5.5 hours. The polyimide solution after removing the reaction reflux had a concentration of polyimide of 20%.

The molecular weight of the thus produced polyimide block copolymer was measured as in Example 1. The number average molecular weight was 31,900 and the weight average molecular weight was 54,500.

The polyimide solution was applied to the both surfaces of polyethylene naphthalate films (Teonex, commercial product of TEIJIN LIMITED, 25 μm thickness, substrate film) and dried at 130° C. for 5 minutes to form polyimide membranes with a thickness of 1 μm or 2.5 μm on the both surfaces of the films, thereby obtaining Composite Film 1 and Composite Film 2. The films were subjected to a no-load heat treatment in the air in a high temperature incubator at 200° C. for 10 minutes, and the adhesiveness between the polyimide membranes and the substrate films was evaluated by cross cut test (1 mm intervals).

As a result, both films had an adhesion rate of 100/100, so that it was confirmed that these composite films according to the present invention had excellent adhesion with the substrate film.

Example 10

The operations similar to Example 1 were repeated. That is, to the flask, 14.89 g (60 mmol) of bicyclo(2,2,2)-oct-7-ene-2,3,5,6-tetracarboxylic dianhydride, 6.49 g (30 mmol) of 4,4'-diaminodiphenyl sulfide, 1.2 g (12 mmol) of γ-valerolactone, 1.6 g (20 mmol) of pyridine, 80 g of N-methylpyrrolidone and 30 g of toluene were added, and the mixture was heated at 180° C. for 1 hour.

After cooling the mixture in the air, 19.3 g (60 mmol) of 3,4,3',4'-benzophenonetetracarboxylic dianhydride, 53.4 g (60 mmol) of bis(3-aminopropyl)-polydimethylsiloxane (amine value: 416, commercial product of Shin-etsu Chemical Co., Ltd.), 14.27 g (33 mmol) of bis-4-(3-aminophenoxy)phenylsulfone, 57 g of N-methylpyrrolidone and 30 g of toluene were added, and the resulting mixture was stirred at room temperature for 1 hour.

Then 0.98 g (6 mmol) of 5-norbornene-2,3-dicarboxylic anhydride and 20 g of N-methylpyrrolidone were added and the mixture was stirred at room temperature for 0.5 hours and then heated at 180° C. for 4 hours. The polyimide solution after removing the reaction reflux had a concentration of polyimide of 40%.

The polyimide solution was applied to the both surfaces of polyphenylene sulfide films (Torelina, commercial product of TORAY INDUSTRIES, INC., 50 μm thickness, substrate film) and dried at 130° C. for 10 minutes to form polyimide membranes with a thickness of 1 μm or 2.5 μm on the both surfaces of the films, thereby obtaining Composite Film 1 and Composite Film 2. The films were subjected to a no-load heat treatment at 200° C. for 10 minutes, and the adhesiveness between the polyimide membranes and the substrate films was evaluated by cross cut test (1 mm intervals).

As a result, both films had an adhesion rate of 100/100, so that it was confirmed that these composite films according to the present invention had excellent adhesion with the substrate film.

Example 11

The operations similar to Example 1 were repeated. That is, to the flask, 44.67 g (180 mmol) of bicyclo(2,2,2)-oct-7-ene-2,3,5,6-tetracarboxylic dianhydride, 13.69 g (90 mmol) of 3,5-diaminobenzoic acid, 3.6 g (36 mmol) of γ-valerolactone, 4.75 g (60 mmol) of pyridine, 240 g of N-methylpyrrolidone and 90 g of toluene were added, and the mixture was heated at 180° C. for 1 hour.

After cooling the mixture in the air, 58.0 g (180 mmol) of 3,4,3',4'-diphenyltetracarboxylic dianhydride, 149.76 g (180 mmol) of bis(3-aminopropyl)-polydimethylsiloxane (amine value: 416, commercial product of Shin-etsu Chemical Co., Ltd.), 42.82 g (99 mmol) of bis-4-(3-aminophenoxy) phenylsulfone, 2.95 g (18 mmol) of 5-norbornene-2,3-dicarboxylic anhydride, 204 g of N-methylpyrrolidone and 90 g of toluene were added, and the resulting mixture was heated at 180° C. for 5.5 hours. The polyimide solution after removing the reaction reflux had a concentration of polyimide of 40%.

The molecular weight of the thus produced polyimide block copolymer was measured as in Example 1. The number average molecular weight was 35,500 and the weight average molecular weight was 57,400. The glass transition point of this polyimide was 193° C. to 215° C., and the thermal decomposition initiation temperature was 422° C.

The polyimide solution was applied to the both surfaces of polyphenylene sulfide films (Torelina, commercial product of TORAY INDUSTRIES, INC., 25 μm thickness, substrate film) and dried at 130° C. for 10 minutes to form polyimide membranes with a thickness of 1 μm or 2.5 μm on the both surfaces of the films, thereby obtaining Composite Film 1 and Composite Film 2. The films were subjected to a no-load heat treatment at 210° C. for 10 minutes, and the adhesiveness between the polyimide membranes and the substrate films was evaluated by cross cut test (1 mm intervals).

As a result, both films had an adhesion rate of 100/100, so that it was confirmed that these composite films according to the present invention had excellent adhesion with the substrate film.

Example 12

The operations similar to Example 1 were repeated. That is, to the flask, 14.89 g (60 mmol) of bicyclo(2,2,2)-oct-7-ene-2,3,5,6-tetracarboxylic dianhydride, 4.56 g (30 mmol) of 3,5-diaminobenzoic acid, 1.2 g (12 mmol) of γ-valerolactone, 1.6 g (20 mmol) of pyridine, 80 g of N-methylpyrrolidone and 30 g of toluene were added, and the mixture was heated at 180° C. for 1 hour.

After cooling the mixture in the air, 19.33 g (600 mmol) of 3,4,3',4'-diphenyltetracarboxylic dianhydride, 53.4 g (60 mmol) of bis(3-aminopropyl)-polydimethylsiloxane (amine value: 416, commercial product of Shin-etsu Chemical Co., Ltd.), 14.27 g (33 mmol) of bis-4-(3-aminophenoxy) phenylsulfone, 53 g of N-methylpyrrolidone and 30 g of toluene were added, and the resulting mixture was stirred at room temperature for 1 hour.

Then 0.98 g (6 mmol) of 5-norbornene-2,3-dicarboxylic dianhydride and 20 g of N-methylpyrrolidone were added and the mixture was stirred at room temperature for 0.5 hours and then heated at 180° C. for 4 hours. The polyimide solution after removing the reaction reflux had a concentration of polyimide of 40%.

The molecular weight of the thus produced polyimide was measured as in Example 1. The number average molecular weight was 28,000 and the weight average molecular weight was 51,000.

The polyimide solution was applied to the both surfaces of polyphenylene sulfide films (Torelina, commercial product of TORAY INDUSTRIES, INC., 75 μm thickness, substrate film) and dried at 130° C. for 10 minutes to form polyimide membranes with a thickness of 1 μm or 2.5 μm on the both surfaces of the films, thereby obtaining Composite Film 1 and Composite Film 2. The films were subjected to a no-load heat treatment at 210° C. for 10 minutes, and the adhesiveness between the polyimide membranes and the substrate films was evaluated by cross cut test (1 mm intervals).

As a result, both films had an adhesion rate of 100/100, so that it was confirmed that these composite films according to the present invention had excellent adhesion with the substrate film.

Example 13

To a three-necked 1L flask, a stainless steel anchor agitator, a nitrogen-introducing tube, and a condenser comprising a cooling tube having balls mounted on a trap with a stop cock, were attached.

To the flask, 35.3 g (120 mmol) of 3,4,3',4'-diphenyltetracarboxylic dianhydride, 27.48 g (30 mmol) of bis(3-aminopropyl)-polydimethylsiloxane (amine value: 458, commercial product of Shin-etsu Chemical Co., Ltd.), 5.17 g (60 mmol) of crotonic acid, 4.75 g (60 mmol) of pyridine, 150 g of N-methylpyrrolidone and 40 g of toluene were added, and the mixture was heated at 160° C. for 1 hour under stirring.

After cooling the mixture in the air, 29.78 g (120 mmol) of bicyclo(2,2,2)-oct-7-ene-2,3,5,6-tetracarboxylic dianhydride, 62.85 g (215 mmol) of 1,3-bis-(4-aminophenoxy)benzene, 1.484 g (10.02 mmol) of phthalic anhydride and 144 g of N-methylpyrrolidone were added, and the resulting mixture was stirred at room temperature for 1 hour, then heated at 140° C. for 30 minutes, and then at 10° C. for 4.5 hours, under stirring. The polyimide solution obtained while eliminating the reaction reflux during the heat treatment at 180° C. but after 1 hour from the beginning of the heat treatment at 180° C. had a concentration of polyimide of 35%.

The molecular weight, in terms of polystyrene, of the thus produced polyimide block copolymer was measured by the GPC method using a UV detector (HLC820 commercially available from Tosoh Corporation was used). The number average molecular weight was 7120, the weight average molecular weight was 17,400 and Z average molecular weight was 26,400. The glass transition point was 205° C. and the thermal decomposition initiation temperature was 444° C.

The obtained polyimide solution was applied to the both surfaces of a polyethylene terephthalate film commercially available from TEIJIN LIMITED (Type G-2, 38 μm thickness) and dried at 130° C. for 5 minutes, thereby obtaining a composite film having polyimide membranes with 1 μm thickness on both surfaces thereof.

Example 14

The operations similar to Example 13 were repeated. That is, to the flask, 44.67 g (180 mmol) of bicyclo(2,2,2)-oct-7-ene-2,3,5,6-tetracarboxylic dianhydride, 13.69 g (90 mmol) of 3,5-diaminobenzoic acid, 3.6 g (36 mmol) of γ-valerolactone, 4.7 g (60 mmol) of pyridine, 240 g of N-methylpyrrolidone and 90 g of toluene were added, and the mixture was heated at 180° C. for 1 hour under stirring at 180 rpm.

After cooling the mixture in the air, 58.0 g (180 mmol) of 3,4,3',4'-benzophenonetetracarboxylic dianhydride, 149.76 g (180 mmol) of bis(3-aminopropyl)-polydimethylsiloxane (amine value: 416, commercial product of Shin-etsu Chemical Co., Ltd.), 42.82 g (99 mmol) of bis[4-(3-aminophenoxy)phenyl]sulfone, 2.95 g (18 mmol) of 5-norbornene-2,3-dicarboxylic dianhydride, 204 g of N-methylpyrrolidone and 90 g of toluene were added, and the resulting mixture was allowed to react at 180° C. for 25 minutes, thereby obtaining a polyimide solution having a concentration of 40%.

The molecular weight of the thus produced polyimide was measured as in Example 1. The number average molecular weight was 35,500 and the weight average molecular weight was 57,400. The glass transition point of this polyimide was 193° C. to 215° C., and the thermal decomposition initiation temperature was 422° C.

The obtained polyimide solution was applied to the both surfaces of a polyethylene terephthalate film commercially available from TEIJIN LIMITED (Type G-2, 38 μm thickness) and dried at 130° C. for 10 minutes, thereby obtaining a composite film having polyimide membranes with 2.5 μm thickness on both surfaces thereof.

Example 15

The rates of heat shrinkage in the longitudinal and transverse directions of the composite films produced in Examples 13 and 14 were measured. For comparison, the rate of heat shrinkage of the substrate film was also measured. The results are shown in the following Table 1.

TABLE 1

| | Rate of Heat Shrinkage (%) | | | | | |
|---|---|---|---|---|---|---|
| Heat | Substrate Film | | Example 13 | | Example 14 | |
| Treatment Conditions | Longitudinal Direction | Transverse Direction | Longitudinal Direction | Transverse Direction | Longitudinal Direction | Transverse Direction |
| 150° C., 30 min. | 0.9 | 0.06 | 0.008 | 0.002 | 0.009 | 0.002 |
| 180° C., 10 min. | unmeasureable | unmeasurable | 0.016 | 0.001 | 0.016 | 0.001 |

As shown in Table 1, the polyethylene terephthalate film used as the substrate film is deformed to a shape for which the rate of thermal shrinkage cannot be measured upon being heated at 180° C. which is higher than its melting point, while the composite films according to the present invention are not substantially shrunk by the heat. Further, when heating at 150° C., the rates of heat shrinkage of the composite films according to the present invention are much smaller than that of the substrate film. These results indicate that the composite films according to the present invention have much higher heat resistance than the substrate film used.

Industrial Availability

The composite film according to the present invention can be applied to various uses such as wall-paper, surface-protecting films of various articles, insulation films, circuit boards and resistors, which exploit the heat resistance, chemical resistance and/or insulation performance.

What is claimed is:

1. A composite film comprising a substrate film and polyimide membrane(s) formed on at least one surface of said substrate film, which polyimide membrane(s) is(are) prepared by coating said surface(s) with a solution of a solvent-soluble polyimide whose main chain is formed by polycondensation of one or more tetracarboxylic dianhydrides and one or more diamines and by drying said solution, said one or more tetracarboxylic dianhydrides including bicyclo(2,2,2)oct-7-ene-2,3,5,6-tetracarboxylic dianhydride as at least a part thereof, and/or said one or more diamines including at least one of 3,5-diaminobenzoic acid and a diaminosiloxane derivative as at least a part thereof.

2. The composite film according to claim 1, wherein the proportion of said bicyclo(2,2,2)oct-7-ene-2,3,5,6-tetracarboxylic dianhydride in the total tetracarboxylic dianhydrides is 20 to 50 mol %, and the proportion of the total of said 3,5-diaminobenzoic acid and said diaminosiloxane derivative in the total diamines is 35 to 60 mol %.

3. The composite film according to claim 1, wherein said polyimide contains a diaminosiloxane derivative having an amine value of 200 to 1000 in the main chain thereof at a ratio of 15 to 60% by weight based on the entire polyimide.

4. The composite film according to claim 3, wherein said polyimide further contains as diamines at least one selected from the group consisting of 3,4'-diaminodiphenyl ether, 1,4-bis(3-aminophenoxy)benzene, bis-{4(3-aminophenoxy)phenyl}sulfone and 3,5-diaminobenzoic acid.

5. The composite film according to any one of claims 1 to 4, wherein said diaminopolysiloxane derivative is bis(3-amino-($C_1$–$C_6$)alkyl-polydimethylsiloxane.

6. The composite film according to claim 1, wherein said polyimide is prepared by said polycondensation using a mixture containing a lactone and a base as a catalyst.

7. The composite film according to claim 6 wherein said lactone is γ-valerolactone and said base is pyridine and/or methylmorpholine.

8. The composite film according to claim 6 or 7, wherein said polyimide is a polyimide block copolymer having a ratio of total diamines to total tetracarboxylic anhydrides of 1.05 to 0.95, which copolymer is prepared by a two-step polycondensation process wherein a polyimide oligomer is first prepared by using either one of a tetracarboxylic dianhydride or a diamine in excess, and then a tetracarboxylic dianhydride and/or diamine is(are) added.

9. The composite film according to claim 1, wherein said polyimide has a weight average molecular weight in terms of polystyrene measured by gel chromatography of 15,000 to 100,000.

10. The composite film according to claim 1, wherein said polyimide membrane has a thickness of 0.2 to 10 μm.

11. The composite film according to claim 1, wherein said substrate film is a polyester film or a polyphenylene sulfide film.

12. The composite film according to claim 11, wherein said polyester is polyethylene terephthalate or polyethylene naphthalate.

13. The composite film according to claim 1, wherein said drying is carried out a temperature of 80 to 200° C.

* * * * *